United States Patent
Mande

(10) Patent No.: US 6,173,898 B1
(45) Date of Patent: Jan. 16, 2001

(54) MEMORY CARD OF THE CONTACTLESS TYPE

(75) Inventor: Mickaël Mande, Orleans (FR)

(73) Assignee: Schlumberger Systemes, Montrouge (FR)

(*) Notice: Under 35 U.S.C. 154(b), the term of this patent shall be extended for 0 days.

(21) Appl. No.: 09/309,771

(22) Filed: May 11, 1999

(30) Foreign Application Priority Data

May 11, 1998 (FR) .................................................. 98/05888

(51) Int. Cl.[7] .................................................. G06K 19/02
(52) U.S. Cl. ........................ 235/488; 235/492; 257/679
(58) Field of Search .................................. 235/488, 487, 235/492; 257/678, 679, 690

(56) References Cited

U.S. PATENT DOCUMENTS

| 5,400,950 | 3/1995 | Myers et al. ..................... 828/180.22 |
| 5,448,110 | * 9/1995 | Tuttle et al. ......................... 257/723 |
| 5,598,032 | * 1/1997 | Fidalgo .............................. 257/679 |
| 5,705,852 | * 1/1998 | Orihara et al. ...................... 257/679 |
| 5,852,289 | * 12/1998 | Masahiko ............................. 235/492 |

FOREIGN PATENT DOCUMENTS

| 44 31 605 | 3/1996 | (DE) . |
| 0 645 806 | 3/1995 | (EP) . |
| 0 671 705 | 9/1995 | (EP) . |
| 0 682 321 | 11/1995 | (EP) . |
| 0 737 935 | 10/1996 | (EP) . |
| WO 96/37913 | 11/1996 | (WO) . |

* cited by examiner

Primary Examiner—Thien M. Le
Assistant Examiner—Diane I. Lee
(74) Attorney, Agent, or Firm—Frishauf, Holtz, Goodman, Langer & Chick, P.C.

(57) ABSTRACT

A memory card of the contactless type having a laminated card body of plastic material including a support sheet carrying a coupling antenna and an integrated circuit connected to the antenna. The integrated circuit has two contact pads resting directly on two conductive areas connected to the coupling antenna, and also rests on two compensation areas that are not connected. The integrated circuit and the support sheet are also associated mechanically with each other by an adhesive material disposed in the empty space defined by their respective facing faces.

11 Claims, 3 Drawing Sheets

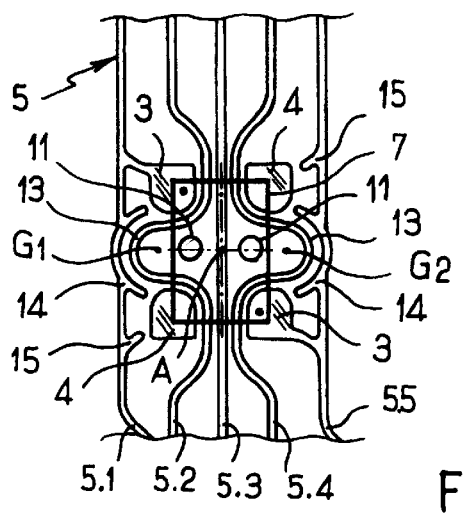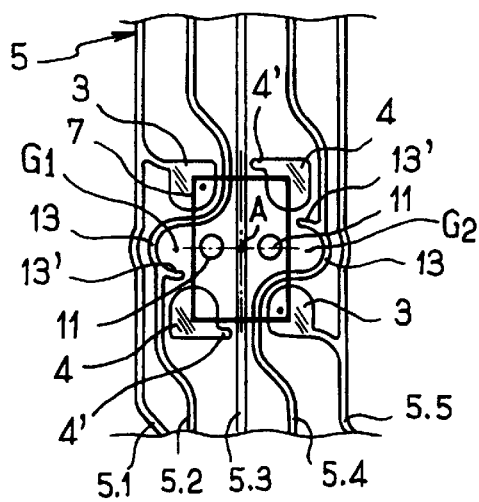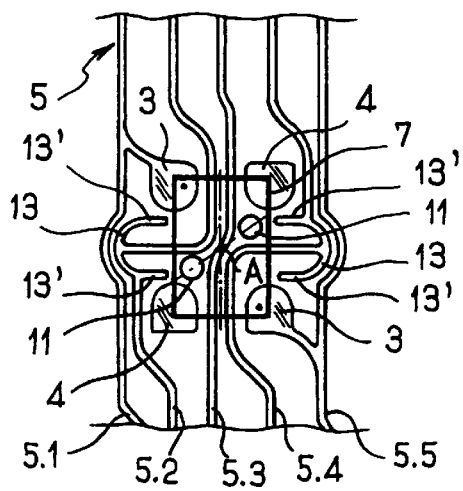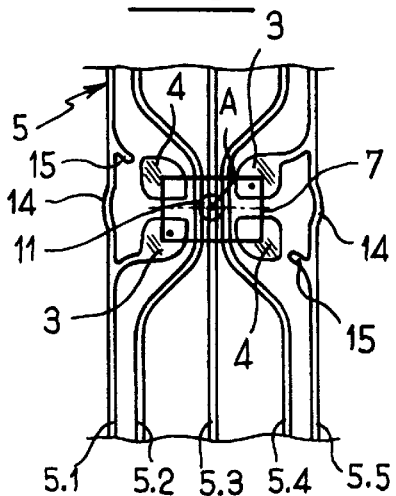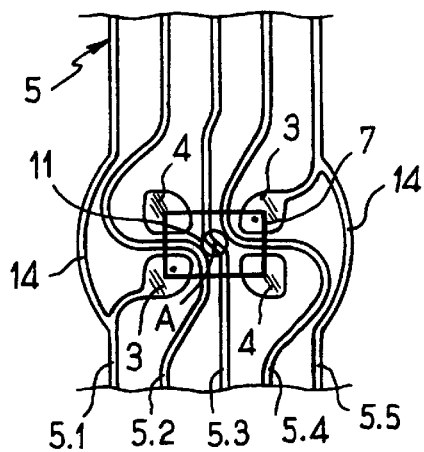

MEMORY CARD OF THE CONTACTLESS TYPE

FIELD OF THE INVENTION

The present invention relates to memory cards of the contactless type. Such cards are commonly used as identity badges or remote payment cards, for example.

BACKGROUND OF THE INVENTION

As a general rule, contactless memory cards comprise an integrated circuit associated with a coupling antenna, both of which are embedded in a flat insulating assembly. In practice, the antenna is arranged in a spiral pattern, with its two ends being connected to two contact pads of the integrated circuit.

Document EP-A-0 671 705 illustrates a contactless card having a card body with a cavity leaving the contact terminals of the coupling antenna visible. Into the cavity is inserted an electronic module that comprises an integrated circuit with two contact areas.

A contactless card of that type has the drawback that it is necessary to form a cavity in the card body, and that the electronic module must be placed as accurately as possible in position in the associated cavity in each card body. Such a process is difficult to make compatible with mass production of contactless cards.

The invention relates more particularly to a contactless memory card of the type comprising a laminated card body of plastic material having a support sheet that is sandwiched between other sheets, or layers, and that has on one face thereof both a coupling antenna and an integrated circuit whose two contact pads are connected to the coupling antenna.

Document EP-A-0 737 935 illustrates a contactless card of that type. The integrated circuit of the contactless card described in that document is associated with the coupling antenna via a layer of anisotropic conductive adhesive material that is about 10 $\mu$m to 50 $\mu$m thick. The contact pads of the integrated circuit are then embedded in the anisotropic conductive adhesive layer. The mechanical connection between the integrated circuit and the insulating support sheet can nevertheless be too weak, insofar as the adhesive layer adheres only to the top faces of the turns of the coupling antenna. Consequently, the mechanical retention of the integrated circuit on the contact areas of the coupling antenna can be insufficient in the event of bending and/or twisting forces being imparted to the laminated card body of the contactless memory card.

Reference can also be made to documents DE-A-4 31 605 and EP-A-0 682 321 which show other arrangements that are analogous.

SUMMARY OF THE INVENTION

One object of the invention is to provide a contactless memory card having a card body made of laminated plastic material, in which the integrated circuit has better mechanical adhesion to the contact areas of the coupling antenna, even when large bending or twisting forces are applied.

Another object of the invention is to provide a contactless type memory card in which the structure is compatible with making a coupling antenna by silk screen printing on the associated support sheet.

These and other objects are attained in accordance with one aspect of the present invention directed to a memory card of the contactless type, comprising a laminated card body of plastic material presenting a sandwiched support sheet having on one face thereof a coupling antenna and an integrated circuit with two contact pads connected to the coupling antenna. The integrated circuit rests via the two pads directly on two conductive areas connected to the coupling antenna, and it also rests on at least one additional compensation area that is not connected to the antenna, so that the integrated circuit extends, or lies, substantially parallel to the support sheet. The integrated circuit and the support sheet are mechanically connected to each other by an adhesive material arranged in the empty space defined by their respective facing faces.

The adhesive material present in the empty space defined by the respective facing faces of the integrated circuit and of the support sheet imparts much greater mechanical strength than that encountered with contactless cards of the prior art.

Preferably, two connected conductive areas and two non-connected compensation areas are provided occupying two diagonals of a rectangle to enable the integrated circuit to be supported directly via its four corners. In particular, turns of the coupling antenna pass between pairs of adjacent areas by extending under the integrated circuit.

According to another highly advantageous characteristic of the invention, the adhesive material comprises one or two spots of adhesive, and a sealing resin occupying the majority of the empty space defined by the respective facing faces of the support sheet and of the integrated circuit. The above-mentioned sealing resin considerably improves the mechanical strength of the assembly. If so desired, this makes it possible to silk screen print the coupling antenna on the support sheet and to provide larger track widths for the connections between the integrated circuit and the silk screen printed contact areas.

At least one of the turns of the coupling antenna passing beneath the integrated circuit preferably presents an external portion extending out from under the integrated circuit. In particular, two turns of the coupling antenna present profiles that correspond in axial symmetry about a center substantially in registration with the center of the integrated circuit, and the external portions of the two turns form two arcs whose concave sides face toward the center of symmetry. Each of the above-mentioned arcs enables a deposited drop of sealing resin to be confined within the concave side thereof, such drops then extending by capillary action into the empty space defined by the respective facing faces of the support sheet and of the integrated circuits.

In a particular embodiment, provision can be made for the non-connected compensation areas to present respective retaining appendices extending toward an adjacent turn of the coupling antenna passing beneath the integrated circuit. These appendices make it possible to form a throat while the liquid resin is flowing beneath the integrated circuit, thereby improving retention and expansion of the liquid resin.

The invention also provides a method of manufacturing a memory card of the above-specified type, such method being remarkable in that prior to laminating the card body, the following successive steps are performed:

a) a coupling antenna, two conductive areas connected to said coupling antenna, and two non-connected compensation areas are formed on one face of the insulating support sheet by etching or by printing, said areas being positioned in a rectangle corresponding to the format of the integrated circuit to be put into place; and b) the integrated circuit is put into place so that two of its pads bear directly on the conductive areas and an adhesive material is interposed in the empty space defined by the facing faces of the support sheet and of the integrated circuit.

Preferably, the adhesive material is interposed firstly by forming one or two spots of adhesive to provide a mechanical link between the support sheet and the integrated circuit, and then depositing at least one drop of sealing resin in the fluid state on the support sheet in the vicinity of the integrated circuit, said drop extending by capillary action into the empty space defined by the respective facing faces.

In the particular case of turns having arcs with their concave sides directed toward the center of symmetry, it is possible to provide for a spot of sealing resin to be deposited within the concave side of each of the arcs.

BRIEF DESCRIPTION OF THE DRAWINGS

Other characteristics and advantages of the invention will appear more clearly on reading the following description relating to a particular, non-limiting embodiment of the invention and given with reference to the figures of the accompanying drawings, in which:

FIGS. 5 to 9 show plan views of other embodiments of layouts for the turns of the coupling antenna in the vicinity of the integrated circuit, which integrated circuit is associated either with two symmetrically disposed spots of adhesive or with a single central spot of adhesive.

DETAILED DESCRIPTION OF THE INVENTION

Figure 1:
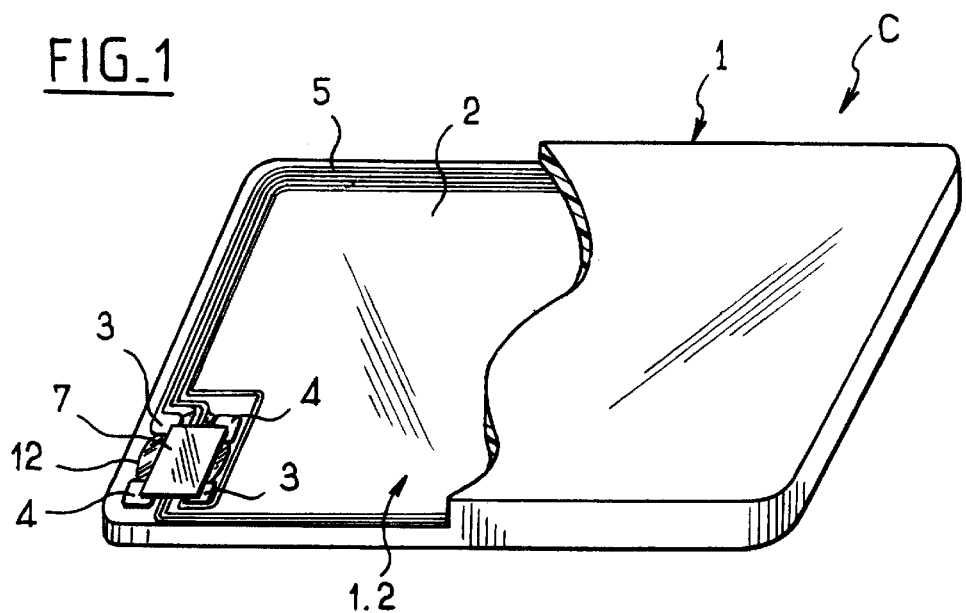
FIG. 1 is a perspective view of a contactless card of the invention from which a covering portion has been removed so as to show more clearly how the antenna is positioned on an associated support sheet and arranged relative to an integrated circuit.
Figure 2:
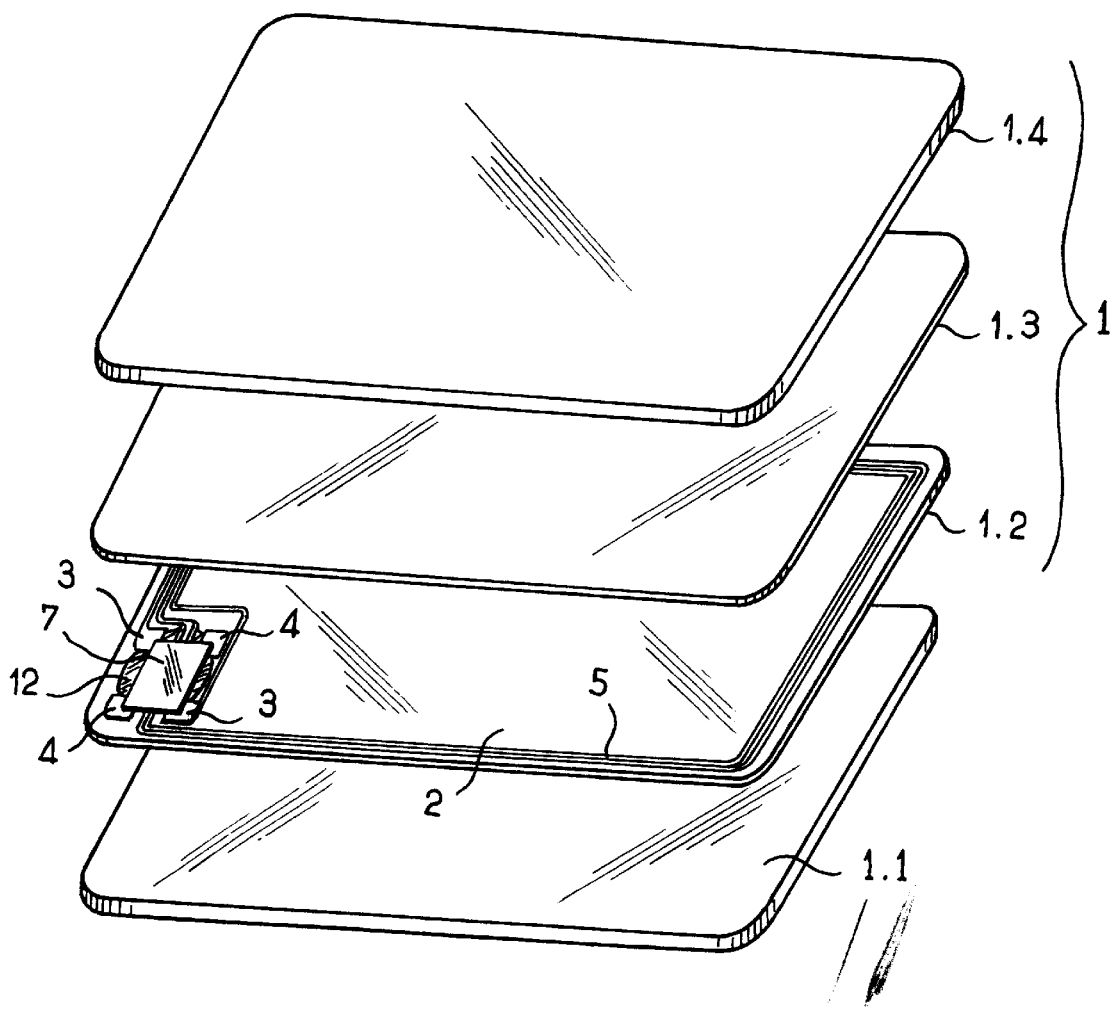
FIG. 2 is an exploded perspective view of the FIG. 1 contactless card, prior to the various layers of the card body being laminated together.

In FIG. 1, there can be seen a memory card C of the contactless type having a card body 1 made of plastic material of the laminated type. FIG. 2 shows the way the various layers concerned are stacked to build up the laminated card body 1, prior to lamination thereof. These layers are, starting from the bottom, a back layer 1.1 of the card, a support sheet 1.2 on which there is placed a coupling antenna surmounted by an integrated circuit, a compensating spacer sheet 1.3, and a front layer 1.4 of the card.

The support sheet 1.2 is thus sandwiched between the other layers forming the card body, and on face 2 of the support sheet 1.2 there is arranged a coupling antenna 5 whose various turns can be seen, which turns, in fact, extend all around the periphery of the support sheet. The coupling antenna 5 is made either of copper using an etching technique applied to a deposit on the sheet, or else by a silk screen printing technique using a conductive ink. These techniques are well known to persons skilled in the art so there is no need to describe them in greater detail.

FIGS. 1 and 2 also show an integrated circuit 7 having two contact pads connected to the coupling antenna 5. The various support areas on which the integrated circuit 7 rests are referenced 3, 4 and are shown diagrammatically in FIG. 1. As described in greater detail below, the areas 3 are conductive areas connected to the coupling antenna 5, while the areas 4 are additional, compensation areas that are not connected to the antenna, so that the integrated circuit 7 rests directly via its four corners on the areas 3, 4. Also shown are the edges of a thickness of material referenced 12 which is constituted, in fact, by a sealing resin that is also present beneath the integrated circuit 7, in the empty space defined by the respective facing faces of the support sheet 2 and of the integrated circuit 7.

Figure 3A:
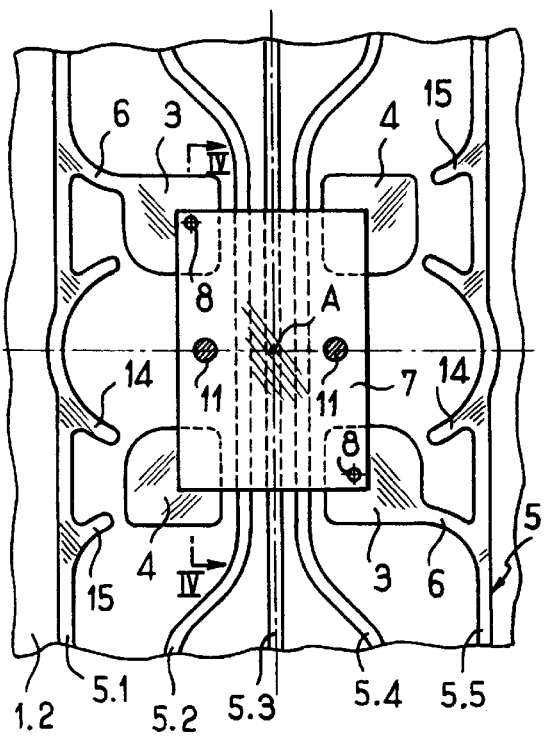
FIGS. 3a and 3b are plan views on a larger scale showing a zone in which the integrated circuit bears against the four associated contact areas provided on the support sheet, respectively before and after deposition of sealing resin passing beneath the integrated circuit.
Figure 3B:
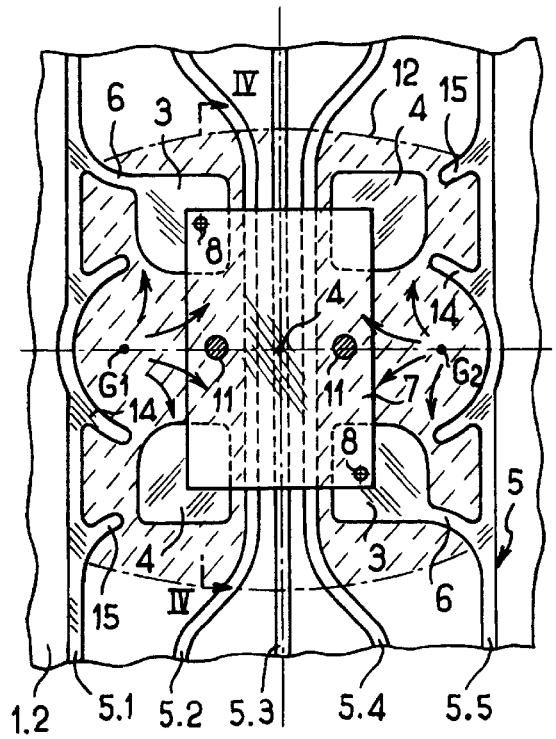
Figure 4A:
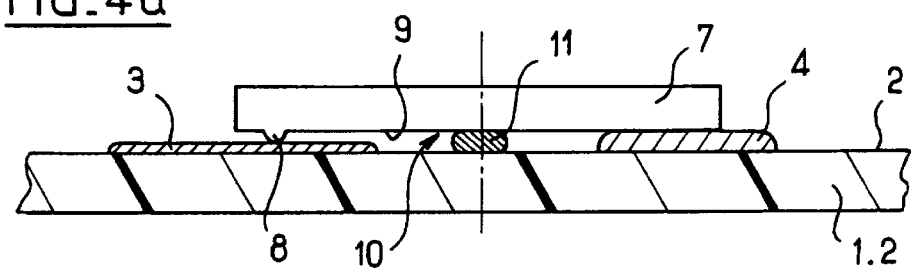
FIGS. 4a and 4b are sections taken along line IV—IV of FIGS. 3a and 3b, respectively, showing more clearly how sealing resin is deposited in the empty space defined by the facing faces of the support sheet and of the integrated circuit.
Figure 4B:
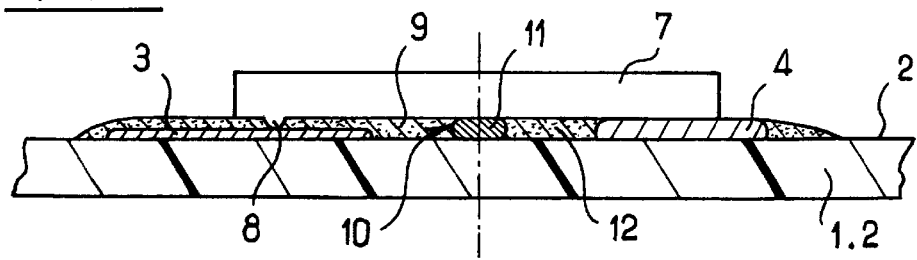

Reference is now made to the embodiment shown in FIGS. 3a and 3b, and to the associated sections of FIGS. 4a and 4b.

Provision is made for the integrated circuit 7 to rest directly via two of its contact pads 8 on two conductive areas 3 connected to the coupling antenna 5, while also resting on at least one additional area 4 for compensation purposes that is not connected to said antenna, so that the integrated circuit lies substantially parallel to the support sheet 1.2. The integrated circuit and the support sheet are mechanically connected to each other by means of an adhesive material disposed in the empty space 10 that is defined by bottom face 9 of the integrated circuit 7, and top face 2 of the support sheet 1.2.

The support areas 3, 4 on which the integrated circuit 7 rests thus serve both to provide electrical connection because of the direct contact between the pads 8 and the conductive areas 3 connected to the coupling antenna 5, and also because of the mechanical support enabling the integrated circuit 7 to be accurately superposed on the support sheet 1.2. Specifically, two conductive areas 3 are provided which are connected to the coupling antenna 5, and two non-connected compensation areas 4 are provided, with the two areas 3 and the two areas 4 lying on two different diagonals of a rectangle so as to enable the integrated circuit 7 to be directly supported via all four corners. The integrated circuit 7 thus rests via its two pads 8 against the conductive areas 3 and via its other two corners against the non-connected areas 4, and the circuit thus lies substantially parallel to the support sheet.

Because the integrated circuit 7 is directly supported on the four support areas 3, 4, it is essential to provide reliable bonding means between the integrated circuit 7 and the support sheet 2. Consequently, a single spot of adhesive interposed between the two facing faces would certainly be insufficient.

That is why, in accordance with an advantageous characteristic of the invention, provision is made for the adhesive material inserted in the space 10 defined by the respective facing faces 2, 9 to include both one or two spots of adhesive (two spots of adhesive 11 in FIGS. 3a to 4b), and also a sealing resin referenced 12 which occupies the majority of the empty space 10 defined by the respective facing faces of the support sheet 1.2 and of the integrated circuit 7. This sealing resin 12 provides extremely reliable mechanical bridging between the two facing faces, and thus confers excellent mechanical strength to the connection of the integrated circuit on the connection areas of the coupling antenna, even in the event of large bending or twisting forces being exerted on the card body.

As explained below, and in accordance with an important aspect of the method of manufacturing the contactless card of the invention, the sealing resin is inserted beneath the integrated circuit 7 by penetrating via capillary action between the two facing faces when the resin, while still in the fluid state, is deposited in the form of drops at appropriate predetermined locations. It has been observed, in a manner that is quite surprising for the person skilled in the art, that the sealing resin, when in the liquid state, can spread in highly favorable manner in a space defined by two parallel facing faces, even though this is not the case if the drop of resin is merely deposited at a determined point on the support face while the face is not covered by the integrated circuit.

As an example, it is possible to use a support sheet 1.2 that is about 250 µm thick, e.g. made of polyvinyl chloride (PVC), with a spiral pattern (for coupling antenna 5) of copper or of conductive ink deposited by silk screen printing to a thickness of about 35 µm. Because the integrated circuit 7 is mounted on the conductive areas 3 (via its contact pads 8) and on the compensation areas 4, a space 10 is defined between two parallel planes to have a height of about 85 µm. It is this space which is occupied for the most part by the above-mentioned sealing resin 12.

As can be seen in FIGS. 3a and 3b, the turns of the coupling antenna 5 pass between pairs of adjacent areas 3, 4, extending beneath the integrated circuit 7. Specifically, the five turns that constitute the coupling antenna 5 in this case are referenced 5.1 to 5.5, with two of the turns passing outside the footprint of the integrated circuit 7, i.e. the turns 5.1 and 5.5, while the three middle turns 5.2, 5.3, and 5.4 pass beneath the integrated circuit 7. The very reliable mechanical bonding implemented between the integrated circuit and the associated support sheet makes it possible to envisage tracks of considerable width for the coupling antenna, and more particularly to select larger track widths for the connections between the integrated circuit and the silk screen printed areas. This also makes it possible to increase the number of turns for the coupling antenna, and consequently to increase the range of the antenna.

In FIGS. 3a and 3b, the conductive areas 3 are connected to the outer turns 5.1 and 5.5 via conductive ties referenced 6. The areas 4 are not connected in any way to the turns, insofar as they are not connected to the antenna (it should be recalled that the areas 4 are thickness-compensation areas and the essential function thereof is to ensure that the integrated circuit is positioned stably on the support sheet).

FIGS. 3a and 4a on the one hand and FIGS. 3b and 4b on the other hand also serve to show more clearly how the above-described memory card is manufactured.

As can be seen in FIG. 3a, the following are made initially on the face 2 of the insulating support sheet 1.2 by etching or by printing: a coupling antenna 5; two conductive areas 3 connected to the coupling antenna 5; and two non-connected compensation areas 4, said areas occupying the corners of a rectangle corresponding to the shape of the integrated circuit 7 that is to be installed. Thereafter, the integrated circuit 7 is put into place bearing directly via two of its pads 8 on the conductive areas 3, with adhesive material being interposed in the empty space defined by the facing faces of the support sheet 1.2 and of the integrated circuit 7. In FIG. 3a, the interposed adhesive material is restricted to making two spots of adhesive 11 for the purpose of establishing a mechanical link between the support sheet 1.2 and the integrated circuit 7.

FIG. 3b shows an additional step of interposing adhesive material by depositing at least one drop of sealing resin in the fluid state on the support sheet 1.2, said drop spreading by capillarity (capillary action) through the space left empty between the respective facing surfaces. In practice, this drop is deposited close to the integrated circuit 7 so that the drop spreads under its own fluidity, and then by the capillarity effect propagates through the empty space defined by the two facing parallel faces, passing beneath the integrated circuit 7. In FIGS. 3a and 3b, it can be seen that the turns 5.1 and 5.5 have respective arcuate portions 14 with the concave sides of these two arcuate portions 18 facing towards a point A which is a center of symmetry for the strips constituting the turns of the coupling antenna 5. The center of symmetry A is substantially in registration with the center of the integrated circuit 7. The advantage of this configuration in the form of arcs 14 is to define two zones in which respective drops of sealing resin in the liquid state can be deposited, with the deposition points being referenced G1 and G2. The edges of the drops are then held so that the drops propagate between the areas 3 and 4, passing under the bottom face 9 of the integrated circuit 7.

The turns 5.1 and 5.5 can also have spurs 15 pointing towards the corresponding adjacent compensation areas 4 so as to confine effectively the spaces in which the sealing resin in the fluid state propagates. Once the resin has spread as far as the limit imposed by its surface tension associated with the material constituting the support sheet, it is observed that the resin occupies the majority of the space defined between the two facing faces of the integrated circuit and of the support sheet. The zone over which the sealing resin expands is represented diagrammatically in FIG. 3b by a shaded zone whose outline is drawn in chain-doted lines.

In FIGS. 3a and 3b, it can be seen that the three center turns 5.2, 5.3, and 5.4 extend over the support sheet 1.2 by passing along the longitudinal direction of the integrated circuit 7. Under such circumstances, the turn segments 5.2 and 5.4 occupy a portion of the space defined between the two facing faces and consequently, when the adhesive resin passes over the segments, the thickness of the resin is relatively small. Mechanical strength is good, but it is possible to design other track shapes for the turns so as to make more space available on the face 2 of the support sheet 1.2 for receiving the full thickness of intermediate sealing resin. As will readily be understood, the larger the area occupied by the sealing resin in the intermediate space, the better the mechanical strength of the bond with the integrated circuit.

FIGS. 5 to 9 show other paths for the turns of the coupling antenna 5 which, in applying the above approach, serves to increase the area occupied by the sealing resin present beneath the integrated circuit 7, and thus to increase the volume available for it.

In FIG. 5, it can be seen that the tracks 5.2 and 5.4 curve around the areas 3 and 4, each having an external portion referenced 13 that comes out from under the integrated circuit 7. These portions 13 in the form of crescent-shaped loops provide spaces that are favorable for receiving two sealing drops at the points G1 and G2, which drops will then spread beneath the integrated circuit 7. The length of each of the turns 5.2 and 5.4 that remain beneath the integrated circuit 7 is thus shorter than in the preceding embodiment, thereby increasing the area available for receiving the intermediate sealing resin. The external portions of the two turns 13 form arcs whose concave sides are directed towards the center of symmetry A.

In FIG. 6, this approach has been taken further, insofar as the turns 5.2 and 5.4 pass under the integrated circuit 7 only where they need to go round the associated conductive areas 3, thereby releasing more intermediate area for the sealing resin. Outside the integrated circuit 7, the turns 5.2 and 5.4 still have arcs 13 with their concave sides turned toward the center of symmetry A, and they now also have spurs 13' to complete the crescent shapes which are now open. Two drops are deposited at the points G1 and G2 as before so as to spread beneath the integrated circuit 7 with maximum thickness for the sealing resin over a large area.

In FIG. 6, there can also be seen appendices 4' projecting from the non-connected compensation areas 4. These appendices 4' extend toward the middle turn 5.3 of the coupling antenna 5 which passes beneath the integrated circuit 7, each appendix co-operating therewith to define a throat for retaining the resin while it is expanding in the fluid state. The preferred passage as formed in this way facilitates good distribution and optimum uniformity for the sealing resin.

FIG. 7 shows another variant in which the two spots of adhesive 11 are disposed on a diagonal relative to the longitudinal direction of the integrated circuit. This serves to provide a longer distance between the two spots of adhesive 11. It can also be seen that the two crescent-shaped external portions 13 which now have two spurs 13' each are slightly different in shape, with the centers of the arcs 13 being connected to the associated branch of the turn 5.2 or 5.4 which comes out from under the integrated circuit perpendicularly to the longitudinal direction thereof.

FIG. 8 shows another variant in which the integrated circuit 7 bearing on the areas 3 and 4 is connected to the support sheet 1.2 by a single central spot of adhesive 11, thereby releasing a large space for the sealing resin which occupies the majority of the space defined between the two facing faces.

FIG. 9 shows yet another variant, likewise with a single spot of adhesive 11 under the center of the integrated circuit 7, but with the turns 5.2 and 5.4 having a detour shape on the same principles as the variant shown in above-described FIG. 6.

The various track paths shown in FIGS. 5 to 9 naturally constitute non-limiting examples only, and numerous other variants are readily apparent to anyone with ordinary skill in the art.

It should be observed that the various shapes shown serve to limit the risk of coalescence occurring if the coupling antenna is silk screen printed on the support sheet, because of the favorable arrangement of the zone which is critical for silk screen printing, namely the zone where the integrated circuit is connected, since in that zone the edges of the tracks and of the areas 3, 4 are very close together.

Although a detailed description of several specific embodiments of the invention is provided above, various modifications thereof will be readily apparent to anyone with ordinary skill in the art. All such modifications are intended to fall within the scope of the present invention as defined by the following claims.

I claim:

1. A contactless memory card, comprising a laminated card body of plastic material including a sandwiched support sheet having on one surface thereof a coupling antenna and integrated circuit with two contact pads connected to said coupling antenna, wherein the integrated circuit rests via said two contact pads directly on two conductive areas connected to the coupling antenna, and also rests on a least one additional compensation area that is not connected to said antenna, so that the integrated circuit lies substantially parallel to the support sheet, said integrated circuit and the support sheet being mechanically associated with each other by an adhesive material located in an empty space defined by respective facing surfaces of the integrated circuit and the support sheet.

2. A memory card according to claim 1, wherein two said conductive areas connected to the coupling antenna and two said compensation areas non-connected to the coupling antenna are provided occupying two diagonals of a rectangle to enable the integrated circuit to be supported directly via four corners of the integrated circuit.

3. A memory card according to claim 2, wherein turns of the coupling antenna pass between pairs of adjacent ones of said areas by extending under the integrated circuit.

4. A method of manufacturing a memory card according to claim 2, wherein prior to laminating the card body the following successive steps are performed:

a) said coupling antenna, said two conductive areas connected to said coupling antenna, and said two non-connected compensation areas are formed on one face of the insulating support sheet by etching or by printing, said areas being positioned in a rectangle corresponding to a shape of the integrated circuit to be put into place; and b) the integrated circuit is put into place so that two of its pads bear directly on the conductive areas and an adhesive material is interposed in the empty space defined by the facing faces of the support sheet and of the integrated circuit.

5. A method according to claim 4, wherein the adhesive material is interposed firstly by forming one or two spots of adhesive to provide a mechanical link between the support sheet and the integrated circuit, and then depositing at least one drop of sealing resin in the fluid state on the support sheet in the vicinity of the integrated circuit, said drop extending by capillarity into the empty space defined by the respective facing faces.

6. A method according to claim 5, for manufacturing a memory card according to claim 7, wherein a drop of sealing resin is deposited in the areas defined by the concave sides of arcs formed by portions of the turns of the coupling antenna.

7. A memory card according to claim 1, wherein the adhesive material comprises at least one spot of adhesive, and a sealing resin occupies a majority of the empty space defined by the respective facing faces of the support sheet and of the integrated circuit.

8. A memory card according to claim 7, wherein turns of the coupling antenna pass between pairs of adjacent areas by extending under the integrated circuit, and wherein at least one of the turns of the coupling antenna passing beneath the integrated circuit presents an external portion extending out from under said integrated circuit.

9. A memory card according to claim 8, wherein two turns of the coupling antenna present profiles that correspond in axial symmetry about a center substantially in registration with the center of the integrated circuit.

10. A memory card according to claim 9, wherein the external portions of the two turns form two arcs whose concave sides face toward the center of symmetry.

11. A memory card according to claim 8, wherein the non-connected compensation areas present respective retaining appendices extending toward an adjacent turn of the coupling antenna passing beneath the integrated circuit.

* * * * *